United States Patent [19]

Urich

[11] Patent Number: 5,339,219

[45] Date of Patent: Aug. 16, 1994

[54] MODULATED ELECTRONIC BREADBOARD

[76] Inventor: Alex Urich, 27402 Via Caudaloso, Mission Viejo, Calif. 92692

[21] Appl. No.: 43,033

[22] Filed: Apr. 5, 1993

[51] Int. Cl.$^5$ .............................................. H05K 7/02
[52] U.S. Cl. .................................... 361/760; 361/736; 361/752; 361/778; 361/785; 257/678; 174/261; 439/55
[58] Field of Search ............... 361/392, 393, 395, 397, 361/399, 400, 401, 410, 412, 413, 415, 728, 729, 730, 736, 744, 748, 752, 760, 761, 778, 785, 784, 796; 439/55, 59, 60, 61, 62, 64, 74; 257/678; 174/255, 260, 261

[56] References Cited

U.S. PATENT DOCUMENTS 4,582,386  4/1986  Martens .......................... 339/176 M
4,907,977  3/1990  Porter ..................................... 439/74

Primary Examiner—Leo P. Picard
Assistant Examiner—Young Whang
Attorney, Agent, or Firm—Blakely, Sokoloff, Taylor & Zafman

[57] ABSTRACT

A modulated electronic breadboard assembly kit for constructing and testing prototype circuits. The kit includes a motherboard that has a plurality of connectors having leads that are connected to a plurality of corresponding pins. The leads between the various connectors can be coupled together by wires wrapped around the pins. The kit also contains a plurality of discrete modules which can be plugged into the connectors of the motherboard. The discrete modules each provide a basic electronic function such as an operational amplifier, an analog to digital converter, a comparator, etc. A prototype circuit can be built with the present invention by merely selecting the desired circuit functions, plugging the corresponding modules into the motherboard and then wiring the leads of the board to connect the modules.

14 Claims, 3 Drawing Sheets

MODULATED ELECTRONIC BREADBOARD

BACKGROUND OF THE INVENTION

1. Field of the Invention

The present invention relates to a breadboard assembly kit which is used to design, build and test prototype electrical circuits.

2. Description of Related Art

Electrical circuits are typically prototyped using a printed circuit board which is commonly referred to as a breadboard. A typical breadboard contains a plurality of plated through holes that are coupled to conductive pins. Discrete electrical components are soldered or simply inserted into the plated holes and coupled together by wires which are wrapped around corresponding pins. The discrete components may include integrated circuits, individual transistors, resistors, capacitors, diodes, that are all connected to create an electrical circuit.

Connecting together individual components is a time consuming process, typically requiring the user to wire wrap and/or solder each lead of each component. Additionally, the circuit(s) must be tested and reworked/modified if any errors or undesirable outputs are detected. Many circuits are constructed from a number of basic circuits, which each have to be individually tested. For example, a circuit design may include an operational amplifier that is connected to a peak detector and a differentiator. Using present techniques, the operational amplifier must be constructed using individual resistors, capacitors and a discrete amplifier which are all attached to the breadboard. The components are connected by wire wrapping the corresponding leads and then tested to insure that the operational amplifier circuit operates properly The same procedure must be repeated for the peak detector and again for the differentiator. Only after the individual circuits are assembled and tested can the user build and test the overall circuit.

It would be desirable to provide a breadboard assembly kit which would considerably reduce the time needed to construct and test a prototype circuit.

SUMMARY OF THE INVENTION

The present invention is a modulated electronic breadboard assembly kit for constructing and testing prototype circuits. The kit includes a motherboard that has a plurality of connectors having leads that are connected to a plurality of corresponding pins. The leads between the various connectors can be manually coupled together by wires wrapped around the pins. The kit also contains a plurality of discrete modules which can be plugged into the connectors of the motherboard. The discrete modules each provide a basic electronic function such as an operational amplifier, an analog to digital converter, a comparator, etc.

A prototype circuit can be built with the present invention by merely selecting the desired circuit functions, plugging the corresponding modules into the motherboard and then wiring the leads of the board to connect only the inputs and outputs of the modules. The breadboard kit of the present invention greatly reduces the time required to build a prototype circuit by providing basic circuit modules that are already built and tested.

Therefore it is an object of the present invention to provide a breadboard assembly kit which greatly reduces the time required to build and test a prototype circuit.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
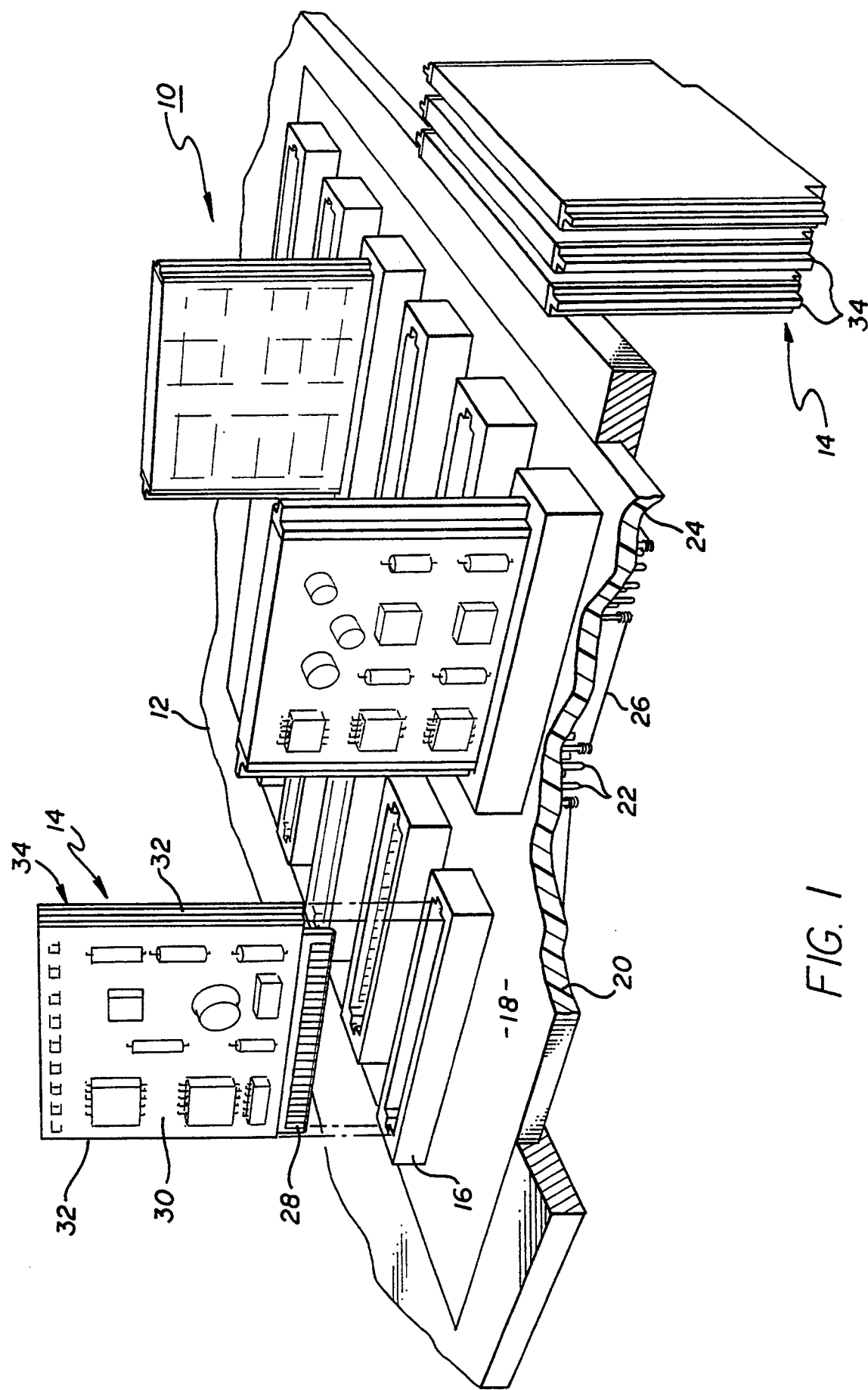
FIG. 1 is a perspective view of breadboard assembly kit of the present invention.

Referring to the drawings more particularly by reference numbers, FIG. 1 shows a breadboard assembly kit 10 of the present invention. The assembly kit 10 includes a motherboard 12 and a plurality of modules 14. The motherboard 12 and modules 14 are adapted so that a user can readily design, build and test a prototype circuit.

The motherboard 12 includes a plurality of electrical connectors 16 that are mounted to a first surface 18 of a printed circuit board 20 and/or a base plate. The connectors 16 each contain a plurality of leads (not shown) that are soldered to the board 20. The leads are connected to pins 22 which extend from a second surface 24 of the circuit board 20. The leads of the connectors 16 can be coupled together by manually wrapping wires 26 around corresponding pins 22.

The modules each have a mating connector 28 which can be plugged into the connectors 16 of the motherboard 12. The modules 14 are typically constructed from a printed circuit board 30. The connectors of the motherboard 12 and the modules 14 are of identical construction, so that any module 14 can be plugged into any connector 16 on the motherboard 12. In the preferred embodiment, the connectors each have 30 pins on either 0.100 or 0.150 inch spacing. The motherboard connector 16 is preferably of the card edge type, wherein the modules 14 have mating conductor pads 32 along an edge of the circuit board 30.

In the preferred embodiment, the motherboard 12 has either 10, 20 or 30 connectors mounted on the printed circuit board 20 on 1 inch center spacing. The connectors 16 are preferably arranged in two rows, wherein a single module 14 may be plugged into two adjacent connectors. The modules 14 are each approximately 2.5×2.5 inches and may contain non-conductive edge members 34 which allow the user to safely handle the cards 14 without damaging the same.

The motherboard 12 may have multiple conductive layers (not shown) which provide power and ground planes for the assembly 10. The power and ground planes may be connected to the same associated pins 22 for each motherboard connector 16. For example, pins 1–4 may be connected to a power plane and pins 27–30 may be connected to a ground plane. All the modules can therefore be constructed to receive power on pins 1–4 and be grounded on pins 27–30.

The modules 14 each contain electrical components that together provide a basic circuit function. For example, one of the modules may function as a peak detector, another module may function as a decoder and so forth and so on. The following is an exemplary list of functions that the modules may provide.

| ANALOG | |
| --- | --- |
| Amplifier | Motor Driver Linear |
| AC | Motor Driver Stepper |
| Differential | Multiplier/Divider |
| Follower | Peak Detector |
| Inverting | Phase Locked Loop Digital |
| Non-Inverting | Phase Locked Loop Analog |
| Single Supply | Power Supply with Current Limit |
| Summing | |
| Amplifier Precision | Pulse Width Modulator |
| Analog to Digital Converter 8 Bit | Precision Rectifier |
| Analog to Digital Converter 12 Bit | RMS to DC Converter |
| Comparator | Sample and Hold |
| Compressor/Expander | Stereo Amplifier |
| Crystal Oscillator/Divider | Switch Analog Single |
| Digital to Analog Converter 8 Bit | Switch Analog Multiplexer |
| Digital to Analog Converter 12 Bit | Timer 555 |
| Filter Multiple Feedback | Transistor Crcuits Small Power |
| Filter Voltage Controlled | Transistor Circuits 0.5 Amp Driver |
| Filter Switched Capacitor | Transistor Circuits 1.5 Amp Driver |
| Function Generator | Transistor Circuits Mosfet |
| Integrator/Differentiator | Voltage Level Detector with Bar Graph Display |
| Instrumentation Amplifier | Voltage Reference |
| | Voltage Controlled Amplifier |
| | V to F/F to V Converter |

| DIGITAL | |
| --- | --- |
| Gates Inverters Buffers | Registers |
| Counters | Comparators |
| Inverters | Flip Flops |
| Inverters | Decoders |
| Microcontrollers | |

The modules are all constructed using commercially available components arranged in conventional circuit designs for each function.

In the preferred embodiment, the modules include power supplies that provide +15 V, −15 V, +5 V and −5 V. Each power supply provide power on designated pins of the connectors 16. For example, the +15 V power supply can provide power on pins 1-2, the +5 V power supply can provide power on pins 3-4 and so forth and so on. The modules 14 will then receive +15 V power on pins 1-2, +5 V power on pins 3-4, etc.

The modules 14 are typically constructed from individual integrated circuit packages and discrete elements such as resistors and capacitors which are soldered to the printed circuit board 30. The resistors and capacitors are soldered to soldering post which allow the user to easily remove and change the value of the elements. Potentiometers can be used when a resistor value is consistently varied. The potentiometers are preferably located along the top edge of the card, so that the user can easily change the resistive value when the module is plugged into the motherboard. Each module may also have a plurality of test pads located along the edge of the card to allow the user to test the components of the module. The modules may also contain switches so that the user can vary the function of the card. The modules of 0 the kit are preassembled and tested so that the user merely has to plug the cards into the motherboard to utilize each circuit function of the modules.

Figure 2:
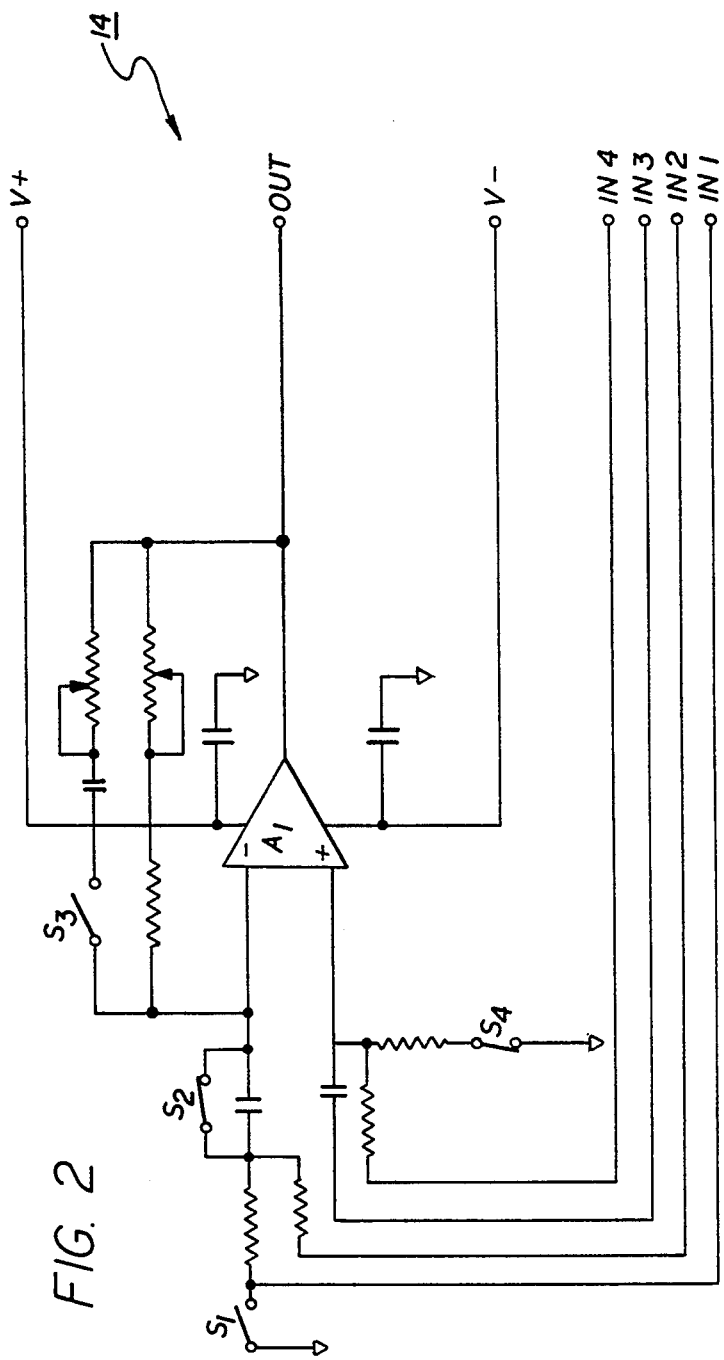
FIG. 2 is a schematic of a module of the breadboard kit that can provide various amplifying functions.

FIG. 2 shows a module 14 which contains an amplifier A1 connected to a number of resistors R1-R5 and capacitors C1-C4. The inputs to the amplifier are controlled by switches S1-S4. The switches are manually operable, so that the user can vary the function of the amplifier to be either an operational, inverting, non-inverting, differential, AC, integrator, differentiator, single supply or summing amplifier. For example, the user can create an operational amplifier by closing switches S2 and S4 and opening switches S1, S3 and S5. The output voltage can be varied by manipulating potentiometers P1 and P2.

In operation, the user picks out the modules 14 which have the functions required to build a prototype circuit. The modules 14 are plugged into the motherboard connectors 16 and the corresponding pins 22 are coupled together by wire wraps 26. Various input/output valves can be varied by moving the potentiometers on the cards. Additional functions can be added by plugging in other cards.

Figure 3:
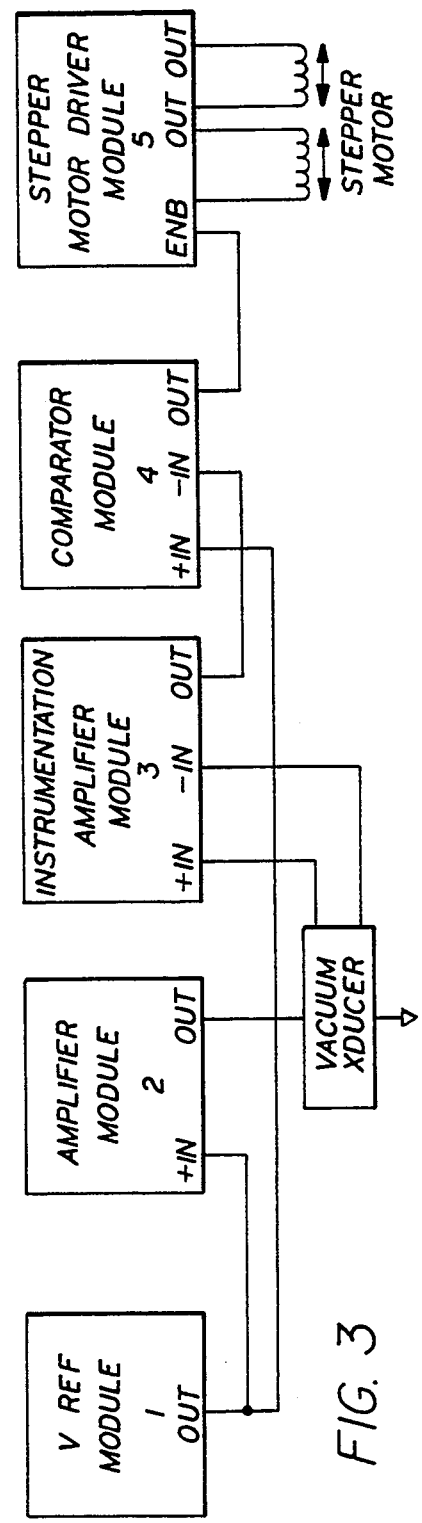
FIG. 3 is a block diagram of a circuit that can be created with the breadboard kit.
Figure 4:
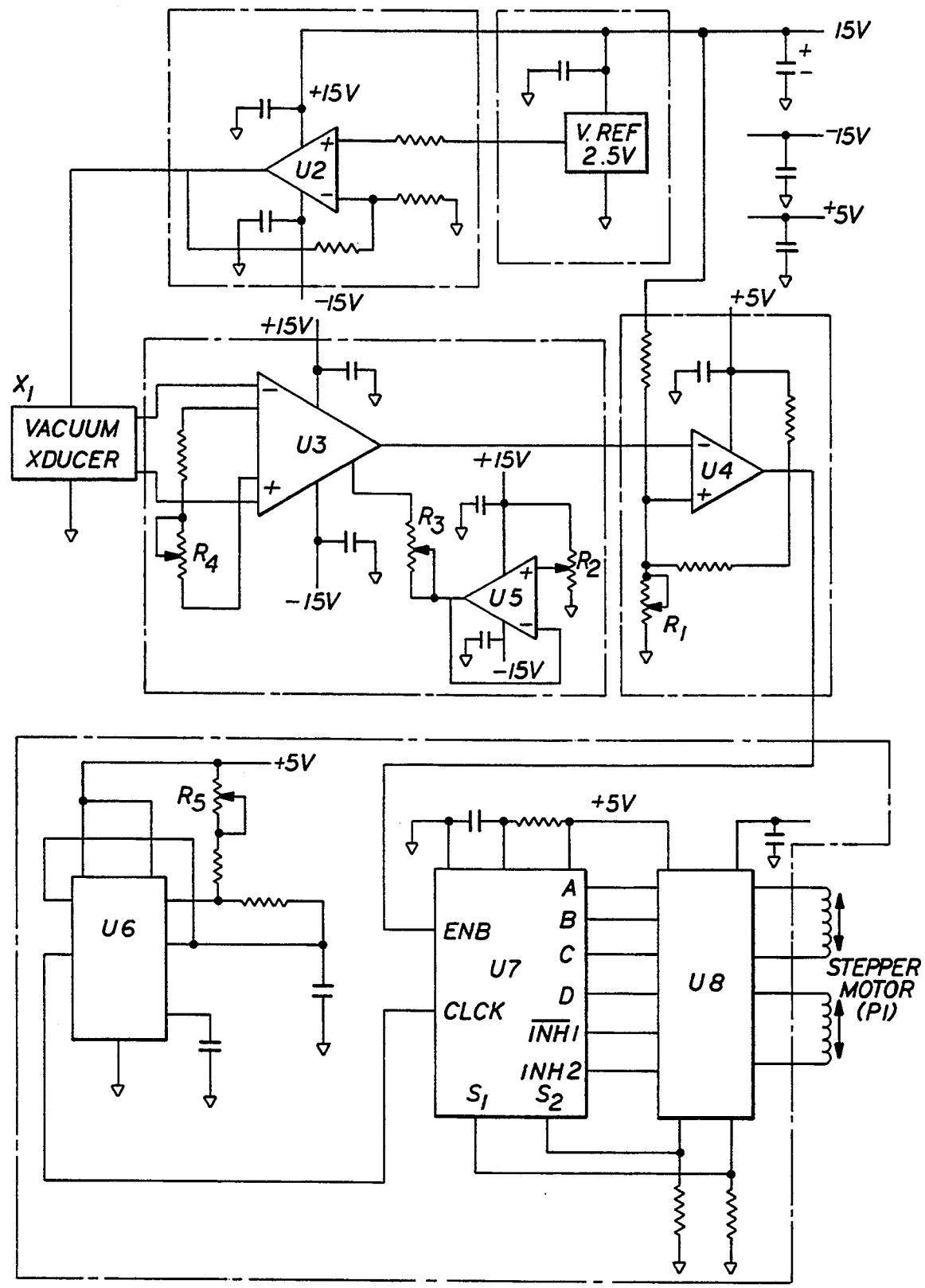
FIG. 4 is a schematic of the circuit of FIG. 3.

FIGS. 3 and 4 provide an example of a prototype circuit which monitors a vacuum transducer in a fluid line and stops the pump of the fluid system when the vacuum reaches a predetermined value. The prototype circuit can be built by first identifying the basic circuit functions, which include a reference voltage supply, an operational amplifier, a monitoring amplifier, a comparator and a motor driver. Separate modules M1-M5 which each provide the corresponding circuit functions can be selected and plugged into the motherboard. The inputs and outputs of each module can be connected in accordance with the schematic shown in FIG. 3, by wire wrapping the pins 22 of the motherboard accordingly. The first module M1 generates a signal with a constant voltage (2.5 V) that is provided to the input pin of the second module M2. The second module M2 contains an amplifier U2 which amplifies the signal and sends the same to the input port of a pressure transducer. The output signal of the transducer is provided to the third module M3. The third module M3 contains an instrumentation amplifier U3 which amplifies the output signal of the transducer and provides an input signal to the fourth module M4. The gain and offset of the instrumentation amplifier U3 is controlled by amplifier U5. The fourth module M4 has a comparator U4 which compares the output of module M3 to a reference voltage. The output of the comparator U4 is provided to the fifth module M5. The fifth module M5 contains a controller U7 which is enabled/disabled by the output signal of the fourth module M4. The fifth module M5 also contains a clock U6 for the controller U7 and a driver U8 for the pump motor of the fluid system.

As can be appreciated by those skilled in the art, the kit may contain an almost infinite number of modules, each providing a different circuit function. The user can design and build a variety of prototype circuits with the kit assembly of the present invention. Although basic circuit functions are shown and described, it is to be understood that the modules could contain a microprocessor and associated hardware to breadboard computer architecture, etc.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A modulated electrical breadboard assembly kit, comprising:
    a motherboard having a plurality of pins;
    a plurality of wires attached to said pins of said motherboard;
    a plurality of connectors mounted to said motherboard and coupled to said pins; and,
    a plurality of individual modules coupled to said connectors, each module providing an electrical function.

2. The kit as recited in claim 1, wherein said wires are wrapped around said pins.

3. The kit as recited in claim 1, wherein said modules include amplifiers, transistors, power supplies, regulators, filters, oscillators, generators, converters, rectifiers, drivers, detectors, switches, modulators, timers, phase lock loops, integrators, differentiators and sample and hold circuits.

4. The kit as recited in claim 1, wherein said modules include inverters, buffers, counters, registers, comparators, latches, encoders and decoders, microcontrollers.

5. The kit as recited in claim 3, wherein said modules include gates, inverters, buffers, counters, registers, comparators, latches, encoders and decoders, microcontrollers.

6. The kit as recited in claim 1, wherein at least one of said modules contains a mechanical switch.

7. The kit as recited in claim 1, wherein at least one of said modules contains a potentiometer.

8. A method for constructing a prototype circuit, comprising the steps of:
    a) providing;
        a motherboard having a plurality of pins;
        a plurality of wires attached to said pins of said motherboard;
        a plurality of connectors mounted to said motherboard and coupled to said pins;
        a plurality of individual modules coupled to said connectors, each module providing an electrical function;
    b) plugging at least two modules into said connectors of said motherboard; and,
    c) attaching said wires to said connectors that are connected to said plugged in modules.

9. The method as recited in claim 8, wherein said modules include amplifiers, transistors, power supplies, regulators, filters, oscillators, generators, converters, rectifiers, drivers, detectors, switches, modulators, timers, phase lock loops, integrators, differentiators and sample and hold circuits.

10. The method as recited in claim 9, wherein said modules include gates, inverters, buffers, counters, registers, comparators, latches, encoders and decoders, microcontrollers.

11. The method as recited in claim 8, wherein said modules include gates, inverters, buffers, counters, registers, comparators, latches, encoders and decoders, microcontrollers.

12. The method as recited in claim 8, wherein said step (c) said wires are wrapped around said pins.

13. The method as recited in claim 8, wherein at least one of said modules contains a mechanical switch.

14. The method as recited in claim 8, wherein at least one of said modules contains a potentiometer.

* * * * *